(12) United States Patent
Zhang et al.

(10) Patent No.: US 7,610,674 B2
(45) Date of Patent: Nov. 3, 2009

(54) METHOD TO FORM A CURRENT CONFINING PATH OF A CPP GMR DEVICE

(75) Inventors: Kunliang Zhang, Milpitas, CA (US);
Daniel G Abels, San Francisco, CA (US); Min Li, Dublin, CA (US);
Yu-Hsia Chen, Mountain View, CA (US)

(73) Assignee: Headway Technologies, Inc., Milpitas, CA (US)

( * ) Notice: Subject to any disclaimer, the term of this patent is extended or adjusted under 35 U.S.C. 154(b) by 408 days.

(21) Appl. No.: 11/352,676

(22) Filed: Feb. 13, 2006

(65) Prior Publication Data

US 2007/0188936 A1    Aug. 16, 2007

(51) Int. Cl.
*G11B 5/127*    (2006.01)
*H04R 31/00*    (2006.01)

(52) U.S. Cl. .............. 29/603.14; 29/603.15; 29/603.16; 29/603.18; 216/65; 360/121; 360/122; 360/317; 427/127; 427/128

(58) Field of Classification Search . 29/603.13–603.16, 29/603.18; 216/65; 360/121, 122, 317, 324–327; 427/127, 128; 451/5, 41
See application file for complete search history.

(56) References Cited

U.S. PATENT DOCUMENTS

| 6,560,077 | B2 | 5/2003 | Fujiwara et al. |
| 6,998,150 | B2 * | 2/2006 | Li et al. ................ 427/130 |
| 7,256,971 | B2 * | 8/2007 | Horng et al. ........... 360/324.11 |
| 2003/0053269 | A1 | 3/2003 | Nishiyama |
| 2004/0190204 | A1 | 9/2004 | Yoshikawa et al. |
| 2005/0002126 | A1 | 1/2005 | Fujiwara et al. |
| 2005/0052787 | A1 | 3/2005 | Funayama et al. |
| 2005/0094317 | A1 | 5/2005 | Funayama |
| 2005/0122633 | A1 | 6/2005 | Nowak et al. |
| 2005/0152076 | A1 | 7/2005 | Nagasaka et al. |

* cited by examiner

*Primary Examiner*—Paul D Kim
(74) *Attorney, Agent, or Firm*—Saile Ackerman LLC; Stephen B. Ackerman

(57) ABSTRACT

Concerns about inadequate electromigration robustness in CCP CPP GMR devices have been overcome by adding magnesium to the current confining structures that are presently in use. In one embodiment the alumina layer, in which the current carrying copper regions are embedded, is fully replaced by a magnesia layer. In other embodiments, alumina is still used but a layer of magnesium is included within the structure before it is subjected to ion assisted oxidation.

5 Claims, 4 Drawing Sheets

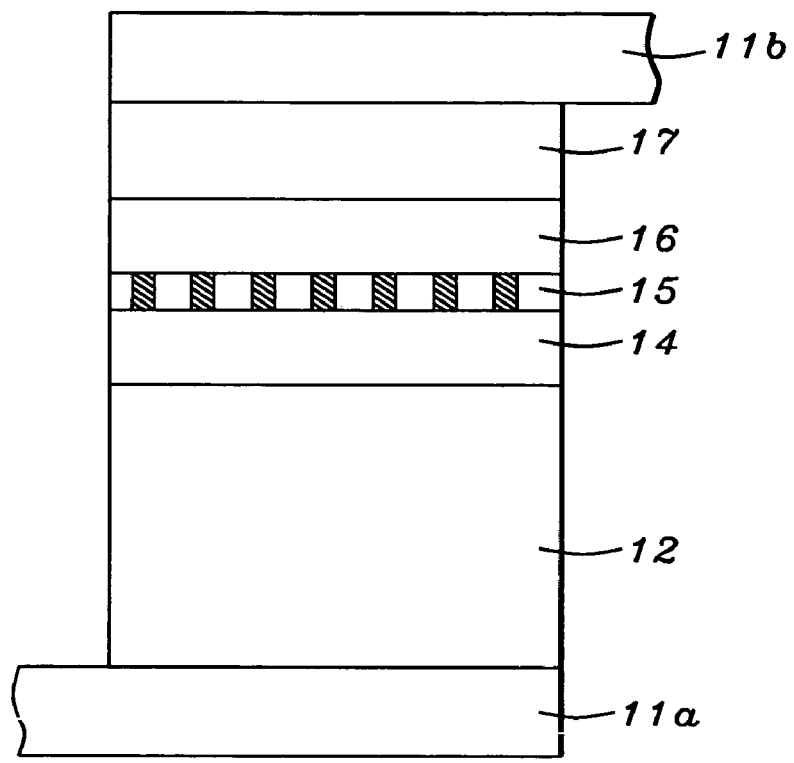
FIG. 1 – Prior Art
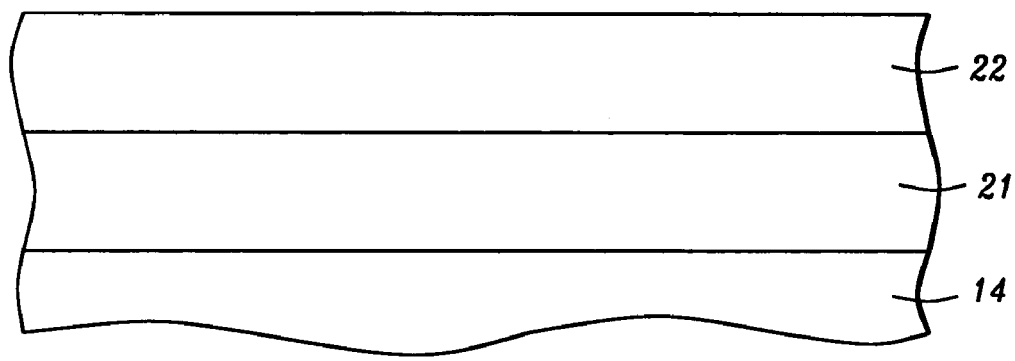
FIG. 2a – Prior Art

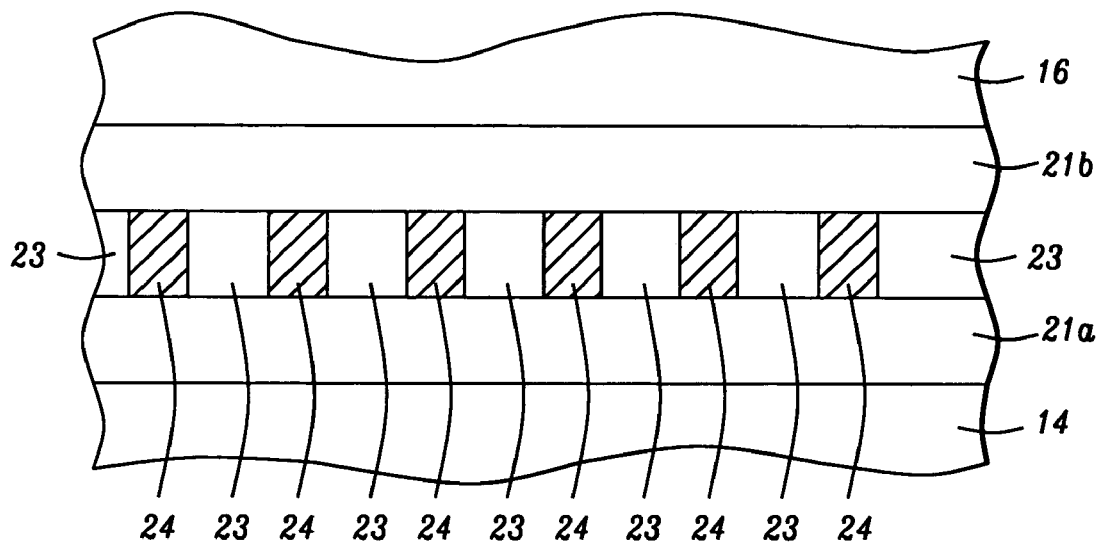
FIG. 2b – Prior Art
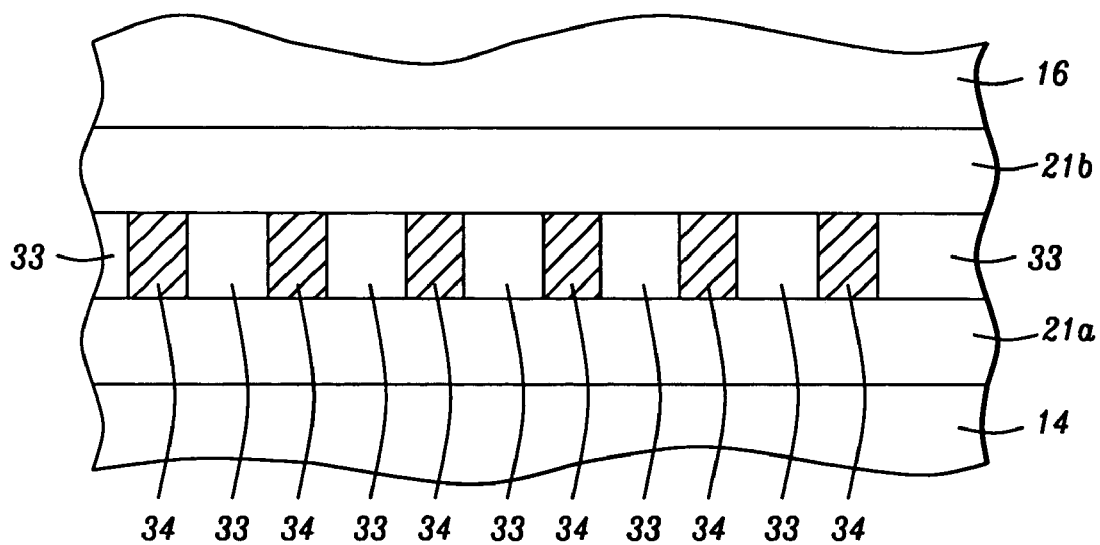
FIG. 3

METHOD TO FORM A CURRENT CONFINING PATH OF A CPP GMR DEVICE

FIELD OF THE INVENTION

The invention relates to the general field of CCP/CPP GMR memory elements with particular reference to the current confining portions.

BACKGROUND OF THE INVENTION

CCP-CPP GMR read heads are considered as promising candidates for 180 Gb/in$^2$ and higher magnetic recording densities. This increase in recording density requires the reduction of the read head dimensions. For example, for 180 Gb/in$^2$, dimensions around 0.1×0.1 microns are required. A CPP read head can be considered functional only if a significant output voltage, Vout, can be achieved when the head senses the magnetic field of a recorded medium. If DR/R is defined as the percentage resistance change, at constant voltage, under the magnetic field for the sensor and V is the voltage applied across the sensor (BHV), then Vout=DR/R× V.

Referring now to FIG. 1, we show there the main features of a CCP-CPP GMR (current confined path-current perpendicular to plane giant magneto resistance) read head device (as well as bottom and top leads 11a and 11b respectively). These are an anti-ferromagnetic (pinning) layer 12, which may include a seed layer (not shown), pinned layer 14 (usually a tri-layer that acts as a synthetic AFM, but shown here as a single layer), a non-magnetic spacer layer 15 (which will be discussed further below), a free layer 16, and a capping layer 17.

When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers, suffer less scattering. Thus, the resistance at this state is lower. If, however, the magnetization of the pinned layer is anti-parallel to that of the free layer, electrons moving from one layer into the other will suffer more scattering so the resistance of the structure will increase. The change in resistance of a spin valve is typically 5-15%.

In the foregoing discussion it was tacitly implied that non-magnetic spacer layer 15 is a homogenous layer of a single conductive material. In the CCP (current confined path) design, the spacer layer is actually a trilayer of two conductive layers (such as copper) with a very thin insulating layer between them. The latter is typically between about 5 and 15 Angstroms thick and includes a limited number of metal paths within itself. Thus, current through the spacer layer is confined to those areas where the two conductive layers contact one another via these metal paths (shown schematically in FIG. 1 as the hatched areas within layer 15).

As can be seen in FIG. 2a, layer 15 is formed by first laying down copper layer 21 followed by AlCu layer 22. Through the addition of several novel features the technology for manufacturing CCP-CPP GMR has been greatly improved. However, there remains some concern with regard to electromigration (EM) in these CCP-CPP GMR devices. The present invention discloses a variety of ways to overcome this problem.

A routine search of the prior art was performed with the following references of interest being found:

U.S. Pat. No. 6,560,077 (Fujiwara et al) teaches that a current-confining path is formed in an insulating layer of a GMR-CPP. U.S. 2005/0002126 (Fujiwara et al) discloses a current-confining layer structure formed of a conductor and an insulator. The conductor may be Al, Mg, Cr, Cu, etc. U.S. 2005/0152076 (Nagasaka et al) teaches that oxidation of an magnetic layer results in a current-confining effect. Oxidation of a magnetic intermediat elayer such as CoFe between two layers of Cu is taught. U.S. 2005/0094317 (Funayama) and 2005/0052787 (Funayama et al) show a current control region comprising AlOx and Cu. Mg or Cr could be used with a copper content of 1% to 50%.

U.S. 2004/0190204 (Yoshikawa et al) shows an intermediate layer comprising Cu/oxidized AlCu/Cu where AlCu is oxidized by IAO. U.S. 2003-0053269 (Nishiyama) teaches that a non-magnetic layer functions as a current confining layer. This layer may be Al2O3, SiO2, or TaO2. U.S.2005.0122683 (Nowak et al) describes forming current-confining paths in the MR stack.

SUMMARY OF THE INVENTION

It has been an object of at least one embodiment of the present invention to provide a CCP CPP GMR device that has good electromigration robustness.

Another object of at least one embodiment of the present invention has been to provide a method for forming said device.

These objects have been achieved by modifying the current confining structures, that are presently in use, through the addition of magnesium. In one embodiment the alumina layer, in which the current carrying copper regions are embedded, is fully replaced by a magnesia layer. In other embodiments, alumina is still used but a layer of magnesium is included within the structure before it is subjected to ion assisted oxidation.

Since magnesium is an excellent oxygen getter, it will take excess oxygen away from AlOx and thereby prevent the copper from being oxidized. Also, Mg insertion at the AlCu layer breaks the growth pattern of the AlCu so the final stress state will be much different from that of a pure alumina layer. All these factors contribute to the electromigration robustness improvement provided by the present invention.

BRIEF DESCRIPTION OF THE DRAWINGS

FIG. 1 illustrates a typical CCP CPP GMR device of the prior art.

FIGS. 2a and 2b show the basic process used to form the CCP region of FIG. 1.

FIG. 3 shows a first embodiment of the invention.

DESCRIPTION OF THE PREFERRED EMBODIMENTS

Figure 4:
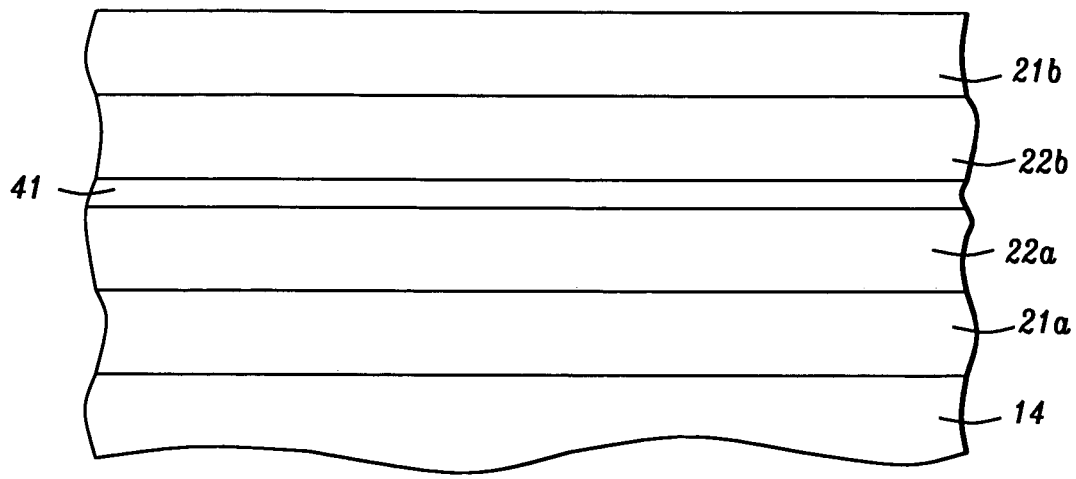
FIG. 4 shows a 2nd embodiment of the invention.

In FIG. 2a we illustrated the initial steps of the constricted path formation process. As part of the present invention, this is now followed by a PT (pre-treatment) step that typically comprises exposure to an Ar plasma etch (20 w, 50 sccm) for about 40 seconds. After PT, the structure is subjected to IAO (ion assisted oxidation) which typically comprises exposure to a 27 W plasma in a mix of 50 sccm Ar and 1 sccm of $O_2$ for about 30 seconds.

As a consequence of the IAO step, former layer 22 can be seen in FIG. 2b to now comprise multiple regions of alumina 23 that surround relatively pure copper regions 24 within which current flowing between the top and bottom conductive leads will now be confined. At the completion of the IAO step, a second copper layer is deposited. This is shown as 21b in FIG. 2b where the original layer 21 is designated as 21a.

As discussed earlier, an AlCu layer has been routinely incorporated within our CCP-CPP GMR structures. After the AlCu deposition, this layer was exposed to oxygen by means of the PT/IAO process which resulted in the formation of an alumina layer, in which were embedded regions of free copper that provided the desired confined current paths. $Al_2O_3$ is, however, known to be amorphous under the above formation conditions suggesting that it would not provide a good template for Cu crystalline growth. This, in turn, leads to a deterioration of the EM robustness and thus introduces a reliability problem.

MgCu alloy, on the other hand, will form a current confining path in MgO through Cu metal segregation following similar PT/IAO treatments of deposited MgCu. Magnesia has been demonstrated to provide a crystalline barrier with a very large dR/R ratio (specifically for the TMR (tunneling magnetoresistance) case). Upon oxidation by the PT/IAO process and post-annealing, it provides a crystalline template suitable for Cu crystalline growth. It follows that the CPP EM robustness will also be greatly improved.

1$^{st}$ Embodiment

Referring now to FIG. 3, we show there a first embodiment of the invention. Starting with magnetically pinned layer 14, copper layer 21a is deposited thereon. This is followed by the deposition of a MgCu alloy layer on layer 21a. This MgCu layer has a composition of Mg(1-x)Cu(x) where x ranges from about 5 atomic % to about 60 atomic %. It has a thickness between about 5 and 15 Angstroms.

Now a pre-treatment by a low power plasma etch is provided which is followed by ion assisted oxidation in a mixture of argon and oxygen. As a result of these treatments, the contents of this MgCu layer segregate themselves into regions 33 of relatively pure magnesia and relatively pure free copper 34, the latter becoming the confined paths through which current will have to flow when traversing the device.

The method ends with the deposition of a second copper layer 21b on copper-magnesia layer 33, followed by the deposition of magnetic free layer 16. Copper layers 21a and 21b each have a thickness between about 1 and 7 Angstroms.

2$^{nd}$ Embodiment

Referring next to FIG. 4, shown there is lower copper layer 21a on which is deposited AlCu alloy layer 22a. As a key feature of the invention, this is followed by the deposition of pure magnesium layer 41 onto which is deposited (second) AlCu alloy layer 22b. This structure is then subjected to the PT/OIA treatment which was described above resulting, as before, in the segregation of the AlCu into regions of alumina and free copper. Also as before, this is followed by the deposition of second copper layer 21b.

The presence of magnesium as a 'dopant' in the final structure ensures the needed level of crystallinity of the alumina that surrounds the copper paths through it.

3$^{rd}$ and 4$^{th}$ Embodiments

Figure 5A:
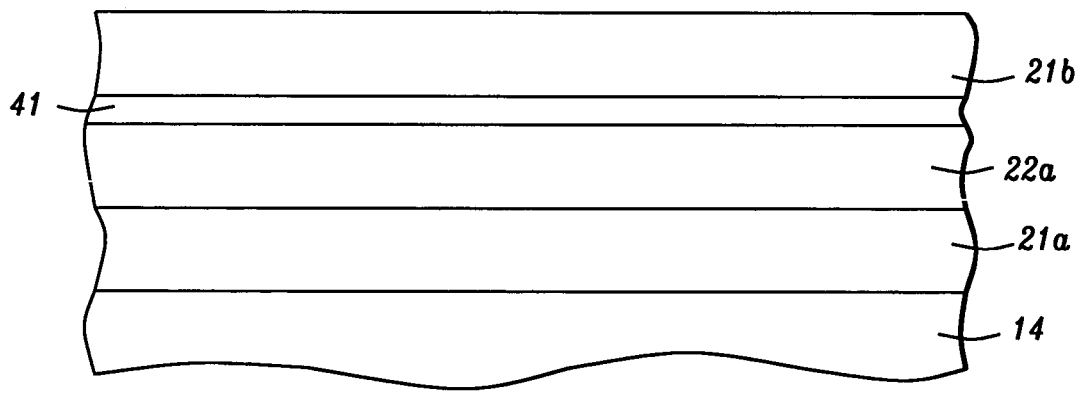
FIGS. 5a and 5b show two more embodiments which are variations of FIG. 4.
Figure 5B:

Referring now to FIGS. 5a and 5b, these embodiments are similar to the 2$^{nd}$ embodiment except that the magnesium layer is located either above the AlCu layer (FIG. 5a) or below it (FIG. 5b), rather than in the middle of it (FIG. 4).

The net result after the PT/IAO treatments is similar to that obtained in the 2$^{nd}$ embodiment.

Experimental Verification

Since the Mg is an excellent oxygen getter, it will take the excess oxygen away from the AlOx and prevent Cu from being oxidized. Also, Mg insertion at the AlCu layer breaks the growth pattern of the AlCu so the stress state will be much different after PT/IAO. All these factors contribute to the EM robustness improvement as we subsequently confirmed through experiments with CPP wafers.

Figure 6:
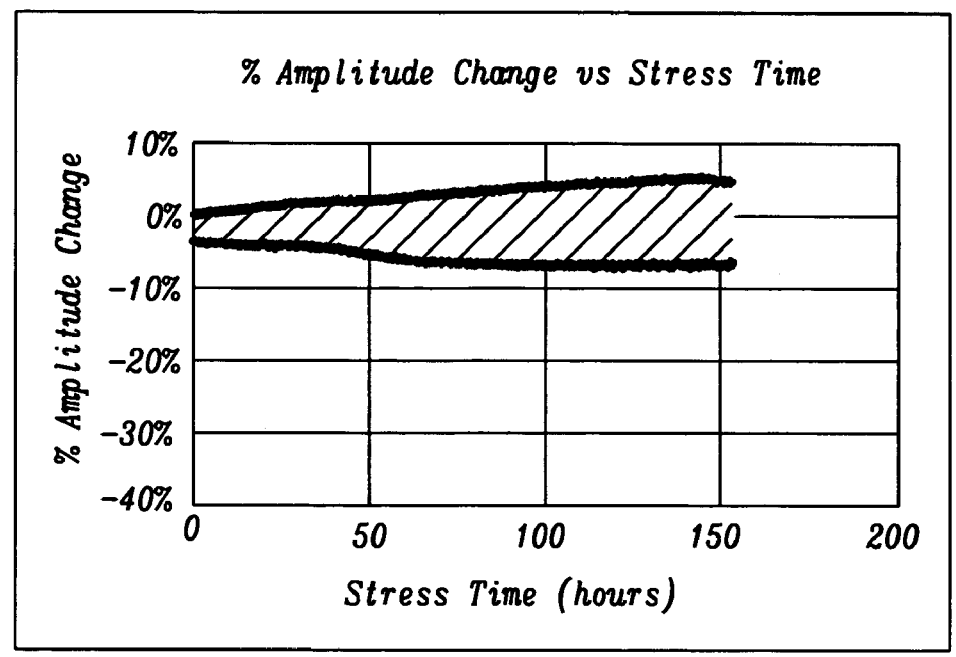
FIGS. 6 and 7 display experimental data that confirm the effectiveness of the present invention.
Figure 7:
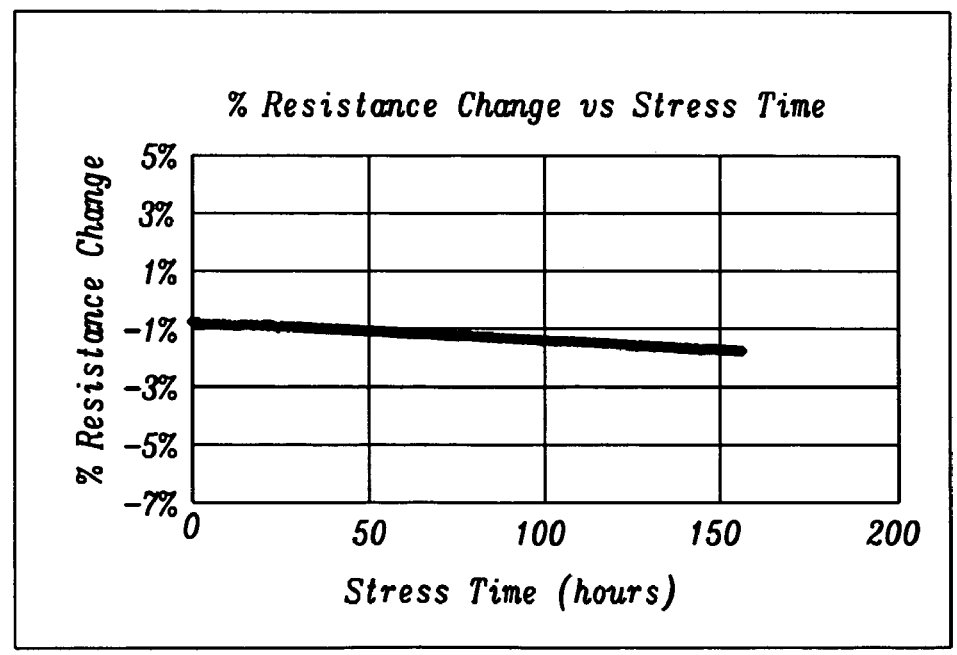

As shown in FIGS. 6 and 7, CPP dR/R (% amplitude) and CPP R (resistance) remain almost unchanged after 150 hours of EM test under 130 mV at 120° C. The structures used for these tests were:

Ta10/Ru10/IrMn70/Fe10%Co8/Fe70%Co9/Fe10%Co15/Ru7.5/Fe70%Co 12/Cu2/Fe70%Co12/Cu5.2/AlCu3/Mg3/AlCu3/PT(20W50sccm35s)/IAO(27W Ar/O=35/0.56 40s)/Cu3/Fe25%Co20/Ni90%Fe28/Ru10/Ta60/Ru30

What is claimed is:

1. A method to form a current confining path as part of a CPP GMR device, comprising:

providing a magnetically pinned layer and depositing thereon a first copper layer;

depositing a layer of MgCu alloy on said first copper layer;

following a pre-treatment, subjecting said MgCu layer to ion assisted oxidation whereby said MgCu layer segregates into regions of magnesia and free copper;

depositing a second copper layer on said copper-magnesia layer, whereby current flow between said first and second copper layers is confined to said regions of free copper; and depositing a magnetically free layer on said second copper layer.

2. The method of claim 1 wherein said MgCu alloy has a composition of Mg (1-x)Cu(x) where x ranges from about 5 atomic % to about 60 atomic %.

3. The method of claim 1 wherein said pre-treatment further comprises etching in a low power plasma and said ion assisted oxidation further comprises exposure to an ionized argon oxygen mixture.

4. The method of claim 1 wherein said magnesium-copper alloy layer has a thickness between about 5 and 15 Angstroms.

5. The method of claim 1 wherein said first and second copper layers each have a thickness between about 1 and 7 Angstroms.

* * * * *